United States Patent [19]

Knodle, III et al.

[11] Patent Number: 5,253,266
[45] Date of Patent: Oct. 12, 1993

[54] MBE EFFUSION SOURCE WITH ASYMMETRICAL HEATERS

[75] Inventors: Walter S. Knodle, III; Paul E. Luscher, both of Sunnyvale, Calif.; Barry K. Caffee, Mt. Pleasant, Mich.

[73] Assignee: Intevac, Inc., Santa Clara, Calif.

[21] Appl. No.: 916,381

[22] Filed: Jul. 20, 1992

[51] Int. Cl.⁵ .................. B05C 11/00; C23C 16/00; H01L 21/203
[52] U.S. Cl. ...................... 373/10; 392/388; 118/726
[58] Field of Search ............ 392/388, 389; 373/10; 219/422, 425; 118/724, 725, 726

[56] References Cited

U.S. PATENT DOCUMENTS

| | | | |
|---|---|---|---|
| 2,665,225 | 1/1954 | Godley, 2nd | 118/726 |
| 2,665,320 | 1/1954 | Chadsey, Jr. | 118/726 |
| 3,572,672 | 3/1971 | Harel | 118/726 |
| 3,634,647 | 1/1972 | Dale, Jr. | 118/726 |
| 4,021,769 | 5/1977 | Edin et al. | 219/548 |
| 4,856,457 | 8/1989 | Knauer | 118/726 |
| 5,034,604 | 7/1991 | Streetman et al. | 392/388 |
| 5,041,719 | 8/1991 | Harris et al. | 118/725 |
| 5,140,939 | 8/1992 | Valentian | 118/725 |
| 5,142,117 | 8/1992 | Hoggatt et al. | 219/85.16 |

FOREIGN PATENT DOCUMENTS

| | | |
|---|---|---|
| 49-91080 | 8/1974 | Japan . |
| 63-155715 | 6/1988 | Japan . |
| 2-204391 | 8/1990 | Japan . |
| 4-198090 | 7/1992 | Japan . |
| 2230792 | 10/1990 | United Kingdom . |

*Primary Examiner*—Bruce A. Reynolds
*Assistant Examiner*—John A. Jeffery
*Attorney, Agent, or Firm*—Stanley Z. Cole

[57] ABSTRACT

An effusion source, for the generation of molecular beams, adapted to be positioned at an angle to the horizontal, within a vacuum chamber, of an MBE system including heating structures around the source to create uniform temperatures across the source in planes substantially parallel to the horizontal to cause uniform temperatures in planes substantially parallel to the horizontal in materials placed within the source and intended for MBE applications. A number of heating embodiments are described.

21 Claims, 9 Drawing Sheets

FIG. 8

MBE EFFUSION SOURCE WITH ASYMMETRICAL HEATERS

BACKGROUND OF THE INVENTION

Field of the Invention

This invention is primarily concerned with an effusion source having its main application in molecular beam epitaxy equipment and a method for the generation of atomic and/or molecular beams from chemical elements or compounds such that the beams, when directed upon a substrate, produce grown layers (typically thin epitaxial films) of improved quality when compared to prior known layers. Although this invention is described with emphasis on Molecular Beam Epitaxy (MBE), the source of this invention and its features are not limited to use in ultra high vacuum (UHV) and/or MBE applications. The source includes a crucible, one end of which is open, the other end of which is sealed if using solid or liquid materials to create the beam or alternatively, if using gaseous or liquid materials or if using a remote source for materials, then with an input feed system at the normally closed end. The crucible is surrounded by a source body containing a thermocouple, crucible heater and other internal construction designed to provide a specific thermal environment for the crucible and for materials used therein.

Definitions

The contraction MBE, as used in this description, refers to Molecular Beam Epitaxy and to related processes, techniques and variations such as MOMBE (Metal Organic Molecular Beam Epitaxy), GSMBE (Gas Source MBE) and CBE (Chemical Beam Epitaxy).

The terms source, molecular beam source, effusion cell, Knudsen cell and furnace refer to a device used to generate or create a molecular beam.

The term molecular beam is used to represent all such atomic, molecular, or combinations of atomic and molecular specie that are effused from any of the above sources.

The term grown film refers to a layer that is deposited upon and/or chemically reacts with a substrate held in the path of a molecular beam source.

The terms thermal shield, thermal partition, thermal baffle and thermal sink are used to describe a physical element that serves to modify the temperature distribution within the body of said source in a specific manner by impeding or expediting the flow of heat.

The term inverted temperature gradient is used to described a thermal profile in a source in which the temperature is highest at the open end and decreases toward its rear or base end.

Source

The new features and improvements in the source are found in 1) the crucible heater design and the location of the heating mechanism within the source; 2) thermal sinks and their positions within the source and their positional relationships to the crucible; and 3) crucible designs. Crucible heater embodiments of this invention provide: 1) increased thermal energy density when compared to prior art designs; 2) specific temperature profiles that accommodate source material asymmetries (with respect to the source axis) and, 3) in the case of liquid source materials, mechanisms that permit source material density differences to create improved beam purity. Thermal sinks are used to augment and influence temperature regions. An inverted (as compared to prior art) temperature gradient within the cell is achieved in the practice of this invention and this contributes considerably to the better grown films and generally to the process improvements of this invention. New crucible embodiments are intended to segregate unwanted materials by density or by differences in materials in liquid source melts.

The process improvements over the prior art created by the source of this invention and its embodiments include: a reduction in beam flux contaminants; improved film properties at higher growth rates; and a reduction in growth defects in films made using this invention.

Description of Related Art

Effusion sources of the prior art consist of three main elements: a mounting flange, a source body, and a crucible. The mounting flange positions the source in the vacuum chamber, provides a vacuum seal, and contains the power and thermocouple feed throughs. The source body consists of a crucible heater, a thermocouple, appropriate support structures and external, thermal insulating layers. The crucible is situated within the source body and holds materials to create the beam. Appropriate materials when positioned within the source when heated will effuse from the crucible mouth as a molecular beam.

Heating elements of the prior art, whether wire, foil or solid (e.g. graphite), inductive or non-inductive, or whether composed of single or multiple sections, have been symmetrical with respect to the source body's axis. Generally uniform heating elements extend along the source body length except for accommodations for power input connections and connections between heating sections. In the prior art, the intent has generally been to produce an isothermal temperature zone within the source. In this invention a primary objective is to create a temperature inversion within the source.

In general, crucibles are maintained in an angular position during the creation of the molecular beam. Typically, efforts are made by manufacturers to achieve isothermal conditions within the crucible for purposes of obtaining uniform material heating. However, in fact, the temperature in such cases varies along the source axis. The effect of this in respect to a crucible at an angle to the horizontal is to create a temperature difference across the surface of the melted materials since the surface extends across an area oblique to the axis (generally the surface will conform to a horizontal plane parallel to the ground) and thus the melted material will be effected by temperature gradients along the axis itself and its surface.

In U.S. Pat. No. 5,034,604, a device to achieve isothermal temperature throughout the crucible is described. However, as illustrated in FIG. 7 of that patent, there is about a 100° C. (Celsius) temperature difference from the open end to the closed end of the crucible. Thus, if the crucible is reasonably full and positioned at an angle to the horizontal as is typically the case in MBE equipment, a significant temperature difference will exist across the surface of the melted material within the crucible. The graphs in this patent show that a temperature inversion does not occur. Except in the unique case of a source vertically oriented (with respect to the horizontal), the effusing surface of the source material will otherwise always lie in a position as to make an oblique angle with the source body and crucible axis. This angle typically varies between approximately 10 and 45 degrees, depending on source orientation within the process chamber. As a result, there can exist a significant temperature difference across the surface of the effusant material. The resulting temperature gradients can be sufficient to generate free convection on the surface of the melt in the liquid source materials. This has been observed within crucibles containing liquid effusing materials. Free convection, it is currently believed, causes the development of impure molecular beams by assisting processes detrimental to beam purity which in turn affects the composition and structure of the growing film and degrades its qualities.

Heating element embodiments of the prior art have been of wire, foil or solid conductors. In many cases these elements have been configured so as to yield a near null magnetic field when driven by an AC power source. This may be important to the proper operation of nearby magnetic field sensitive instrumentation associated with MBE. Alternatively, the heating elements can be DC driven, but this is usually a more expensive option and DC can also cause breakdown of ionic insulators. At least one prior art device involves the use of a solenoidal (about the crucible axis) heating element requiring a DC power source. There are no known examples in the prior art of a heater with solenoidal elements configured to produce equal, adjacent and canceling fields. There are also no known examples in the prior art of a heating element (of any shape) of asymmetrical construction (with respect to the source axis) which is designed to heat in a controlled, but uneven, manner (i.e., varying temperatures) applied to specific regions of the crucible.

Some crucible heaters currently in use are composed of two axially symmetric elements (see, for example, U.S. Pat. No. 5,034,604). The heating element closest to the open end of the crucible is designed to produce a thermal energy density sufficient to counter the radiation losses. A single symmetrical heater element would typically produce a temperature gradient which is hottest at the closed end and coolest at the open end. In one specific application, the generation of a gallium molecular beam, it has been observed that single heating element sources of the prior art will allow gallium droplets to form at the crucible open end (due to condensation on the relatively cool surface). These droplets have been associated with degraded grown film properties (more defects) and are undesirable. A higher heat input near the open end of the source compensates the high radiation losses at that end and produces a more nearly isothermal crucible temperature. Raising the crucible temperature further near the open end will eventually invert the thermal gradient. To prevent gallium droplet formation, the front must be hot enough so that reevaporation exceeds the incident molecular flux. To suppress convection currents, the uppermost source material must be warmer than the material immediately below. These goals are more nearly achieved with the source of this invention and are achieved more effectively than has been done in the prior art. In pursuit of the above, the heater elements of the prior art are run hotter (when compared with the source of this invention) to achieve a given crucible temperature at the open end. The higher heating element temperature causes greater outgassing which may in turn cause deterioration of the film being grown and premature failure of the heater and/or its insulating supports. The heating elements of the present invention generally run cooler (at a given heat output) because of the unique construction of the heating elements themselves. In addition, the source of this invention can produce an inverted temperature gradient and lower winding temperatures in all embodiments, minimizing outgassing, extending heating element life, and producing low grown film defect densities.

There is no example in the prior art of a fully asymmetrical heater designed to invert the temperature gradient. The purpose, aside from droplet elimination, being to heat the uppermost liquid surface preferentially and uniformly and thus minimize any free convection of the effusing material. Thermal shielding has been used around the source body exterior in the prior art to attempt to achieve an isothermal crucible cavity, increase the source thermal efficiency, and reduce unwanted heating of other bodies within the process chamber. Thermal shields of prior art have not been used internal to the source body in association with the crucible itself, to affect the crucible's heat input and temperature profile. In addition, the inverted temperature gradient achieved in liquid melts in sources of this invention may assist the segregation of denser materials within the effusing liquid or melt. These materials (possibly contaminants) move toward the cooler bottom end of the crucible. A crucible according to this invention to utilize this feature may be specifically configured by incorporating a reservoir at its closed end.

SUMMARY OF THE INVENTION

This invention is related to and has as its primary objective the production of improved molecular beams. Such molecular beams are directed at a substrate surface for the purpose of growing a layer or film with specific mechanical and electrical properties. This type of growth usually takes place in an ultra-high vacuum system. The source of this invention is primarily for the generation of molecular beams and especially those created in MBE processes. One particular example is the generation of gallium beams for the growth of gallium arsenide and related compound semiconductor materials.

In general, this invention comprises a new heater design for an effusion source with particular benefits for a crucible mounted, as is generally the case, at a tilt from the vertical which also may include a novel filament structure which is beneficial for any crucible used in MBE. The invention achieves a more uniform (isothermal) temperature throughout the melt and within the crucible. An inverted temperature curve is created and is generally believed to improve growth as to produce grown layers with reduced defects in the grown materials. In addition, the source includes structural designs with the shield internal to the source and with a shield that may be positioned between the heat source and the melt material.

The actual physical design of the source of this invention takes into account the physical state of the material(s) that are to be used, the method of replenishment of these materials during beam generation and the location and manner in which the source is attached to the process vacuum chamber (i.e., its angular position relative to the horizontal). However, the source is not limited in principle to any particular effusing material state (solid, liquid or gas), molecular specie(s), or specific process chamber.

It should be noted that more than one molecular specie may be generated simultaneously within one source of this invention. The materials to be affected need not be of one element or one compound, but may be mixtures of materials any of which may be elements or compounds. Further, all the materials need not be contained within a single source of this invention, but may be introduced from another part of the process chamber or from outside the process chamber on a continuous or intermittent basis Also, materials, such as gaseous materials, may simply be made to pass through and become affected by the source of this invention.

It is an advantage of this invention that its various features may be combined in a manner that optimizes the properties of the molecular beam produced. In any particular embodiment of the source, its features are combined specifically to address the nature of the materials involved. In the case of gallium molecular beams, the liquid gallium is contained within a crucible wherein sections of the crucible are held at different temperatures. The resulting gallium molecular beam being improved (compared to the prior art) in the sense that the resulting grown film possesses reduced defects (greatly reduced in number and size) and the film is grown at a faster rate than that used in the prior art. Typical improvements are a reduction in the number of such defects from 1000 or more per square centimeter (prior art) to under 10 per square centimeter (this invention) in a one micron thick film. In addition, this special conditioning of the gallium molecular beam permits growth rates up to 5 times faster than the prior art without increasing the number of defects in the grown films. The prior art is limited to about one micron per hour growth rate because higher rates result in an increased number of defects. It is a primary objective in connection with the source of this invention and its unique features, that the resulting molecular beam and the grown layer made therewith is of a better quality as measured by grown film properties. Such film improvements do not involve using higher grade materials such as gallium to achieve such results. The use of the source of this invention appears to be the primary reason (which also results in an improved process) film improvements are achieved. These improvements are maintained from a nearly full crucible to a nearly empty crucible. For a specific, tested design: "full" means greater than 100 grams of gallium in a 60 cc tapered crucible and "empty", less than 5 grams. More than ninety percent of the bulk material can be utilized and the claimed improvements of said source is still obtained.

One embodiment of this invention incorporates a crucible heater with solenoidal elements configured in a variety of non-inductive shapes. The heater is arranged to supply different amounts of heat to different regions of the source crucible cavity. The heating efficiency of this design allows the heating elements to operate at lower temperatures extending lifetime and reducing outgassing compared to the prior art at comparable heat output. The solenoid design also obtains the reliability of wire elements and the heating efficiency of foil elements.

Another unique embodiment of this invention takes into account the influence of gravity upon a molten source material. The heating coils, thermal shields and sinks of this invention are designed to create thermal zones skewed (with respect to the source body axis) to accommodate the position of the effusing material. These thermal zones are asymmetric with respect to the cylindrical symmetry of the source. Instead they are structured to create zones of heat, parallel with the horizontal. The prior art makes no accommodation for the asymmetric orientation of a liquid (or solid) source material relative to the cylindrical symmetry of the source. Whereas, this is a key feature of this invention.

The process of this invention is the manipulation and control of the molecular beam in specific manners such that improved results are obtained in the grown film.

These and other features, and advantages of the present invention will become apparent with further understanding through reference to and the description of the following drawings which are intended to be illustrative of the invention.

BRIEF DESCRIPTION OF THE DRAWINGS

FIGS. 1a, b and c are a representation of the preferred source according to this invention.

DESCRIPTION OF EMBODIMENTS

First Embodiment

Figure 1A:
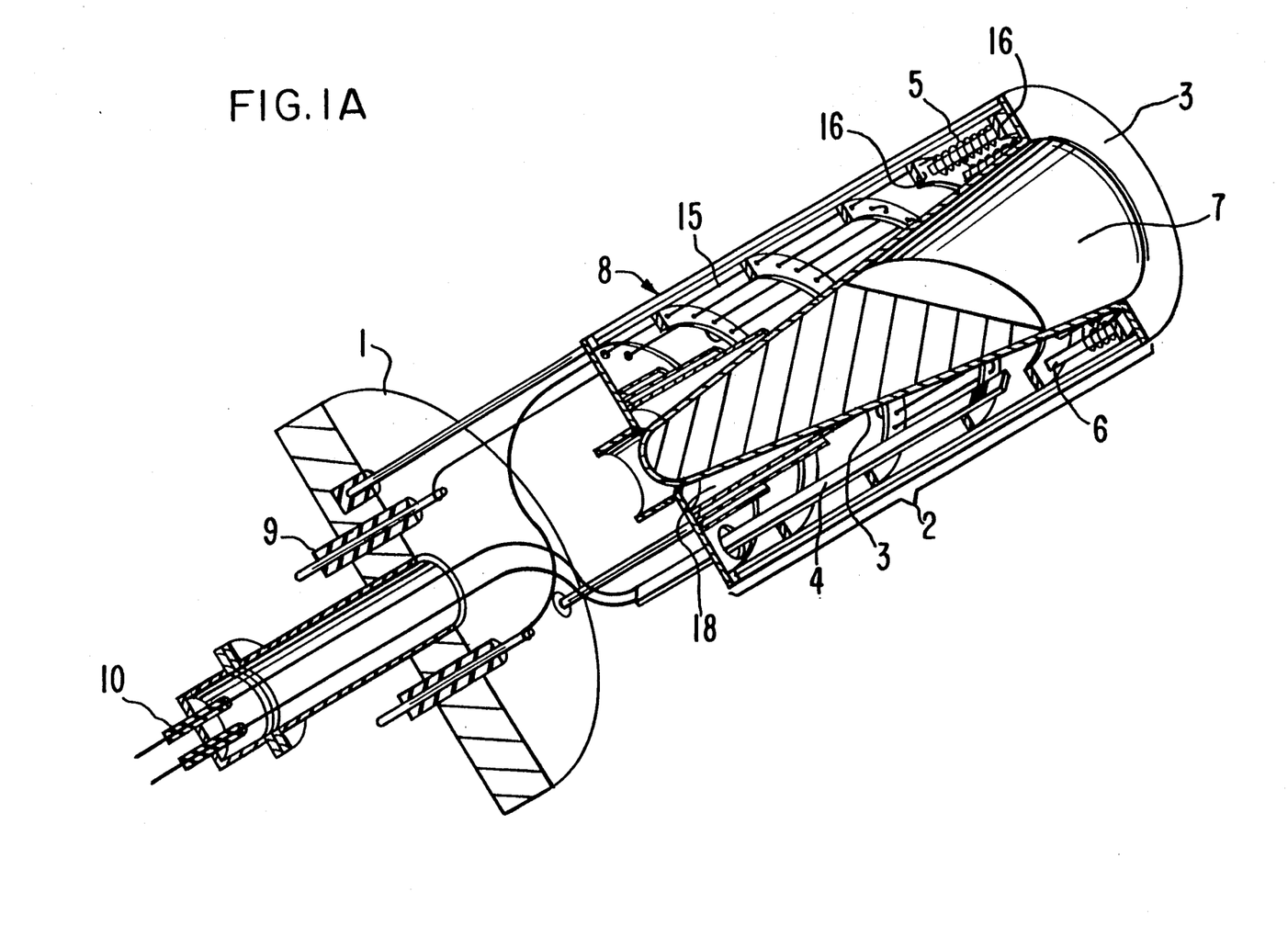
FIG. 1a is a cross-sectional schematic of the embodiment.

Referring now to FIG. 1, there is shown the preferred embodiment of this invention. In FIG. 1a, the source comprises a flange assembly 1, a main body 2, a crucible 3, and a thermocouple assembly 4. The main source body 2, consists of two, asymmetric crucible heating elements, 5 and 15; insulating heater element supports 6, and outer thermal shields 8. Front heating element 5 is constructed so as to heat the source cavity 7 adjacent to the crucible open end. Rear heating element 15 is constructed to heat the remainder of the crucible. Optional thermal shields 18 limit heating of the closed crucible end.

Unlike sources of the prior art, heating elements 5 and 15 are shaped to uniformly heat the melt in a plane which conforms to the surface plane of the melt in position in the crucible. Thus, the crucible heaters of this invention have the ability to invert the crucible temperature gradient of the prior art. Heating element segments 5 and 15 are paired with opposite pitch directions and equal lengths to minimize the net magnetic field and self-inductance. Element pairs can be of different lengths in order to achieve an asymmetric configuration. Insulators 6 maintain the solenoid segment positions. These insulators may be of rectangular, circular, or tubular cross-section and of any insulating material that will contribute a minimum contamination to the process.

Figures 1B, 1C:
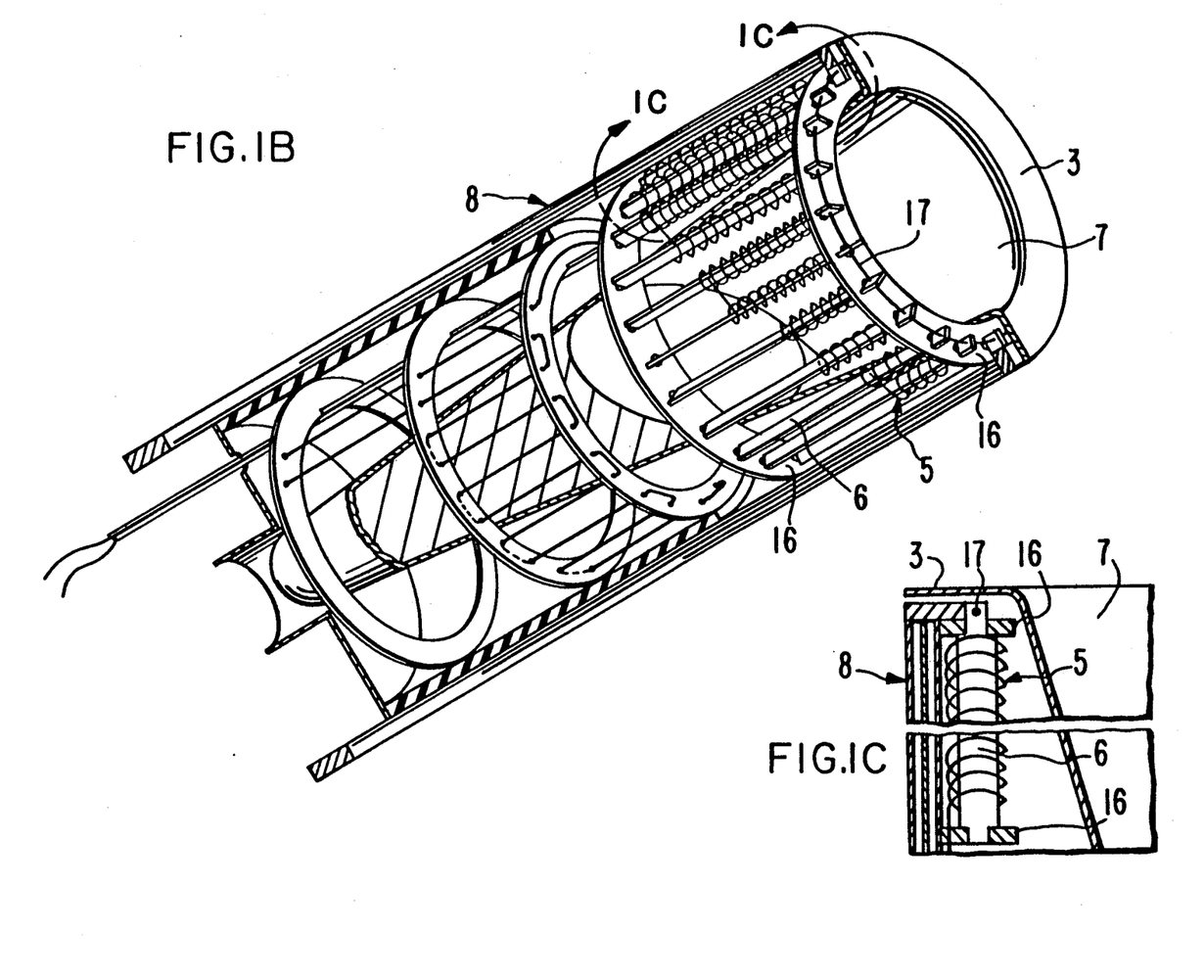
FIG. 1b illustrates the front and rear heaters of FIG. 1a in greater detail.
FIG. 1c in a cross-sectional view of the front heater showing details of the solenoid element and supporting insulators and their relationship to the open end of the crucible.

Rectangular insulators oriented to permit maximum radiation transfer to the crucible cavity are shown in detail in FIGS. 1b and 1c. Insulators 6 are captured at their ends by insulating rings 16 of pyrolytic boron nitride (PBN) or other suitable material. Refractory metal wire 17 is used to secure the insulators 6 to the rings 16 and, in the case of rectangular insulators 6, to orient the long insulator cross-section with radials to the source body axis. Heating element asymmetry can be optimized to each unique source orientation. Although the heater element 5 is illustrated as solenoidal wire and element 15 has straight wire sections, either element can, in general, be any number of alternate configurations and achieve the same results and the objectives of this invention.

Internal thermal shields 18 are optional. These may be tapered and layered shields which augment an inverted temperature gradient by progressively impeding heat flow toward the closed crucible end. An inverted temperature gradient is possible without internal shields, but can be achieved to a greater extent when they are used in the system. The shield 18 may also extend to a point close to the open end of the crucible 3. When so coextensive with the source more effusing material can be handled by the crucible 3 and the inverted temperature gradient is effectively achieved resulting in less defects in the grown layers.

The solenoid element design permits a higher density of thermal radiation when compared to the prior art. The amount of radiation density can be varied throughout the heating element by varying the wire diameter, solenoid diameter and/or the pitch, and the spacing between segment pairs. The heater wire material useful in this invention may comprise any of the high temperature refractory metals which may for example comprise: tantalum, molybdenum or tungsten. Tantalum is usually preferred because its mechanical properties allow it to be formed easily at room temperature.

Figure 5A:
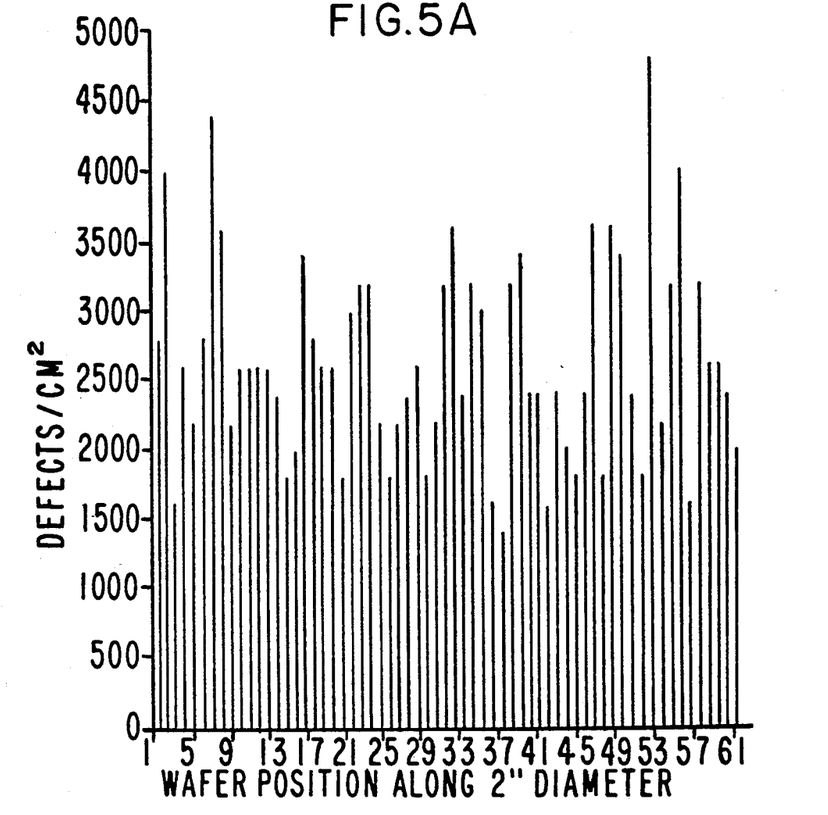
FIGS. 5a and 5b show in graph form, a comparison of substrate growth pursuant to this invention compared to prior art grown layers.
Figure 5B:
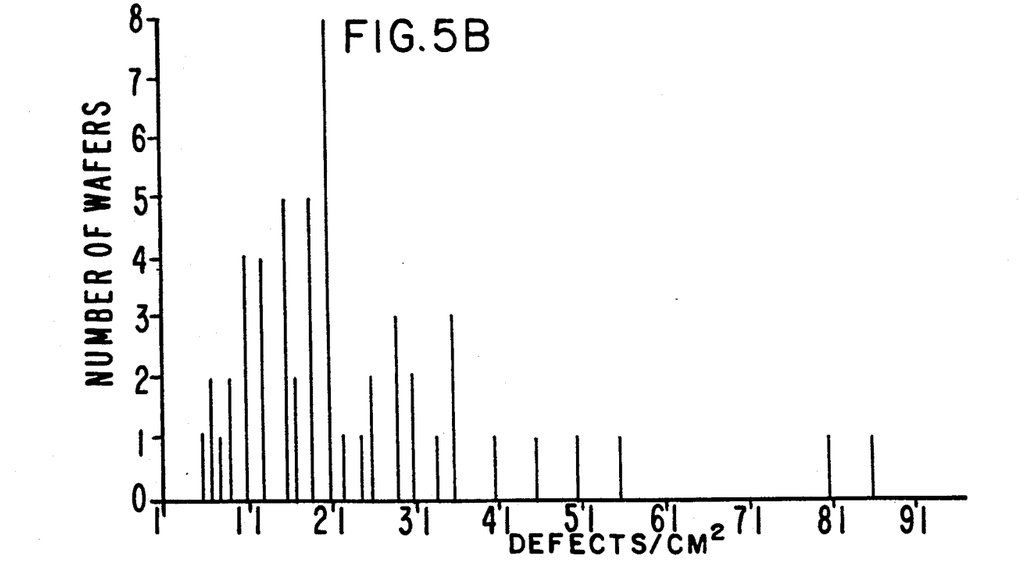

A primary motivation for the construction of asymmetrical heating elements and the concentration of heat at the open end of the crucible is the reduction of growth defects in gallium arsenide and other deposited films. Experimental evidence supports the reduction in measured surface defects when an inverted temperature gradient exists within the crucible cavity. FIGS. 5a and 5b shows experimental data to support the above results for a gallium molecular beam used in the growth of gallium arsenide films. FIG. 5a is a typical result of total defect density across a one micron thick gallium arsenide film when grown using a gallium source of the prior art. FIG. 5b, by contrast, is a histogram of 53 wafers where the average total defect density per micron of film growth is measured for each wafer. The average total defect density per wafer is reduced by approximately two orders of magnitude. The exact mechanism responsible for the low defect results has not been determined. While several mechanisms have been suggested it is our opinion that in respect to gallium, convection currents and chemical reactions involving gallium oxides are responsible. It is also our belief that the inverse temperature profile created by this invention suppresses these mechanisms. It has been an observation of the prior art that the defect density increases with the source temperature (higher effusion flux rates) precluding film growth at higher rates. The art of this invention, because of its suppression of defect density, allows film growth at higher rates and promises to increase MBE system throughput as a result.

Second Embodiment

Figure 2A:
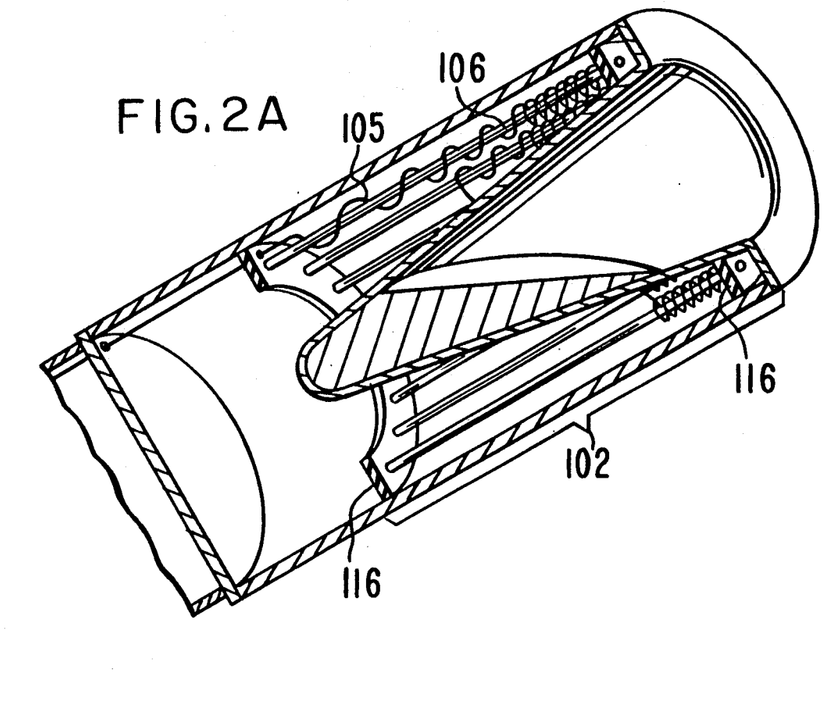
FIGS. 2a and b are schematic sectional views of, in 2a one embodiment of a new crucible heater design featuring an asymmetric heating element designed to accommodate the orientation due to gravity of the liquid effusing surface and, in 2b, a heater in a symmetrical pattern in an opened flat position.
Figure 2B:
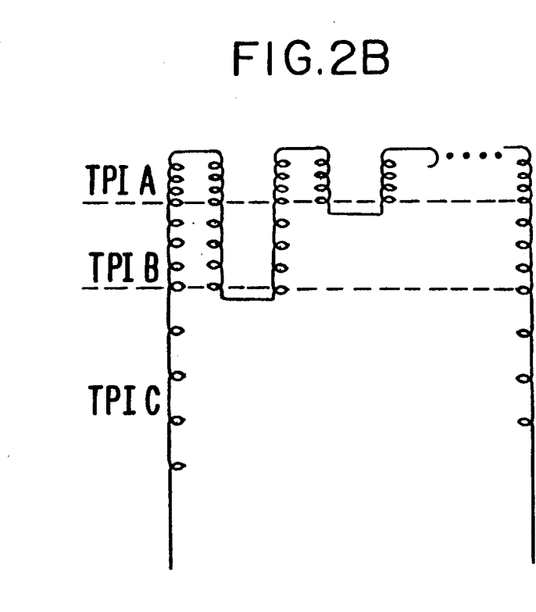
Figure 3A:
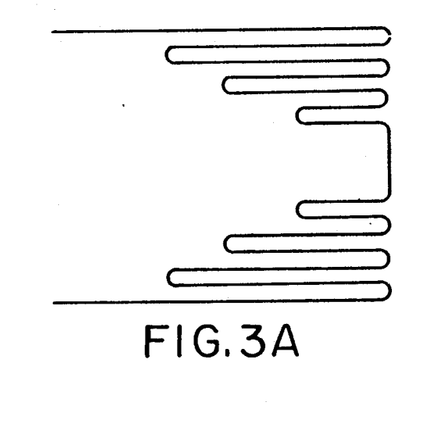
FIGS. 3a through 3e show various embodiments in schematic illustrative drawings of an asymmetric, wire crucible heater design in a flat (opened), schematic form; 3f shows a foil embodiment in flat, schematic form.
Figure 3B:
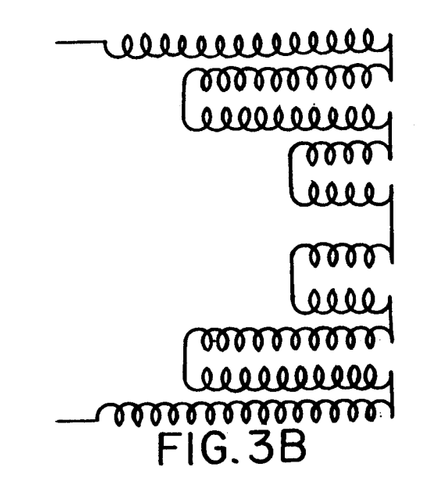
Figure 3C:
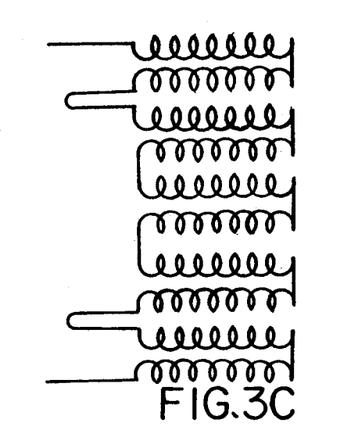
Figure 3D:
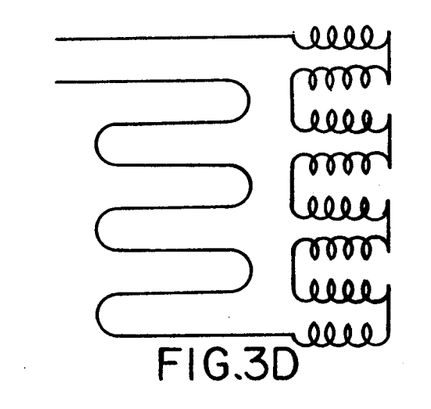
Figure 3E:
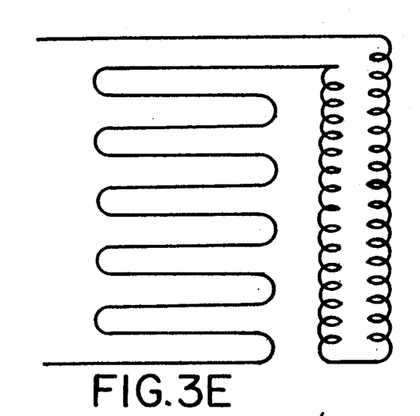
Figure 3F:
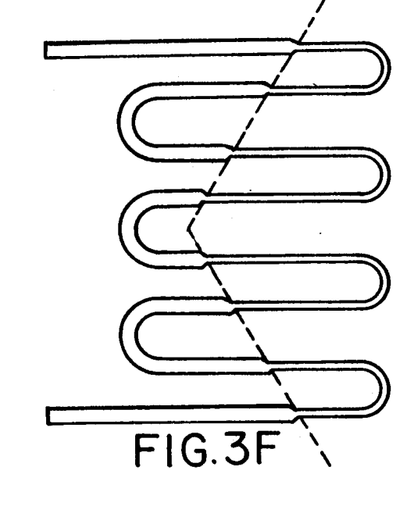

FIG. 2a shows a second embodiment of the source of this invention wherein the heating element 15 is a single solenoidal winding of varying pitch. Varying the pitch allows the radiation heat density (and temperature profile) of the crucible cavity to be affected. Asymmetrical heater configurations and inverted temperature profiles are possible. The heating element design may incorporate segment designs of the prior art as well as solenoidal designs in order to achieve a given temperature profile. FIG. 2b shows a three zone asymmetrical heater in flat (opened) pattern.

FIGS. 3a through 3f illustrate the variety of heater configurations available to produce different thermal energy zones when the prior art is combined with the solenoidal element design of this invention.

Third Embodiment

Figure 4:
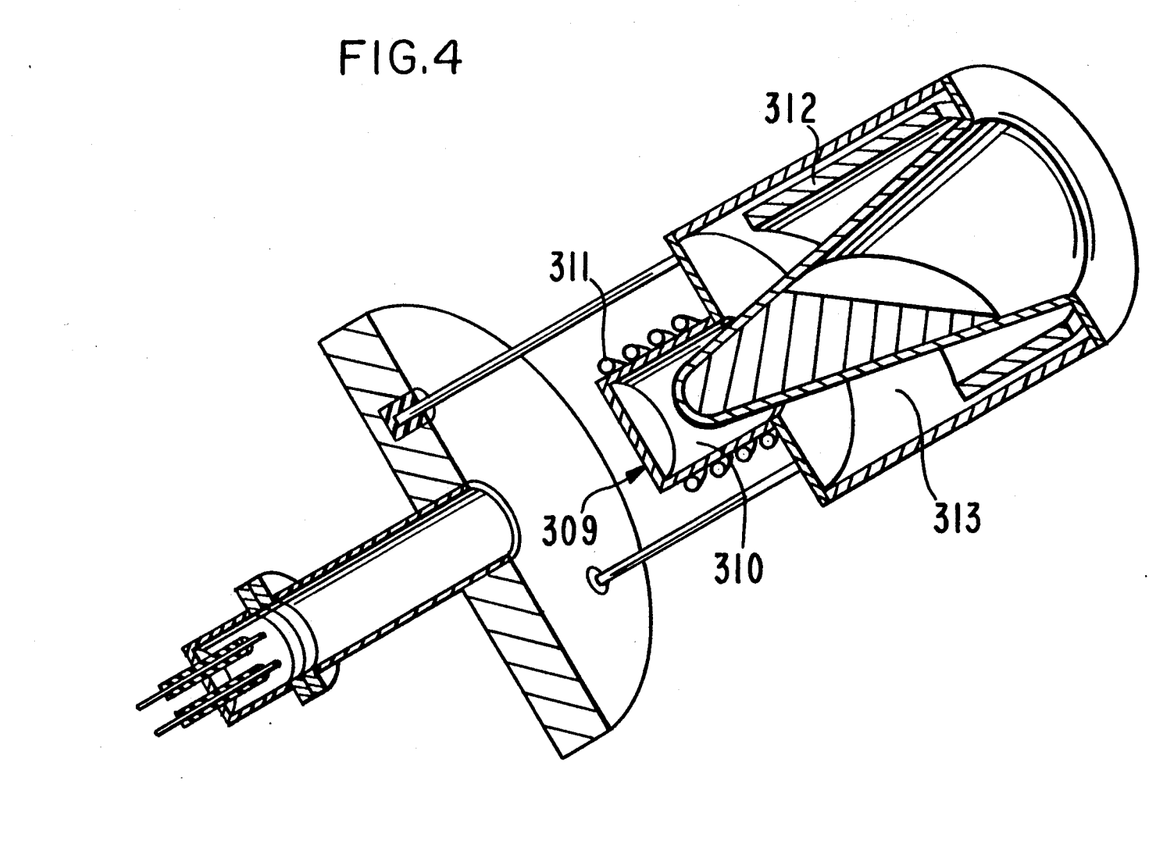
FIG. 4 shows schematically, in partial section, a source according to this invention having a thermal sink configured to cool the closed end of the crucible.

FIG. 4 shows one embodiment of the source of this invention with a thermal sink 309. Thermal sinks can be arranged anywhere within the source body depending on the temperature profile desired. The sink, as applied in this invention, is any passive construction which will decrease the thermal impedance (and thus increase the flow of heat) and lower the temperature difference between a specific source region and the ambient thermal environment. The sink region can be an aperture open to a region of lower temperature 310. This cooler region can be maintained at lower temperature by conduction cooling 311. The cooling medium may be external to the source. Gas or water would be two common embodiments of fluid cooling mediums. The thermal sink cools the closed crucible end and together with the crucible heater 312 creates an inverted temperature gradient within the crucible cavity 313.

Figure 8:
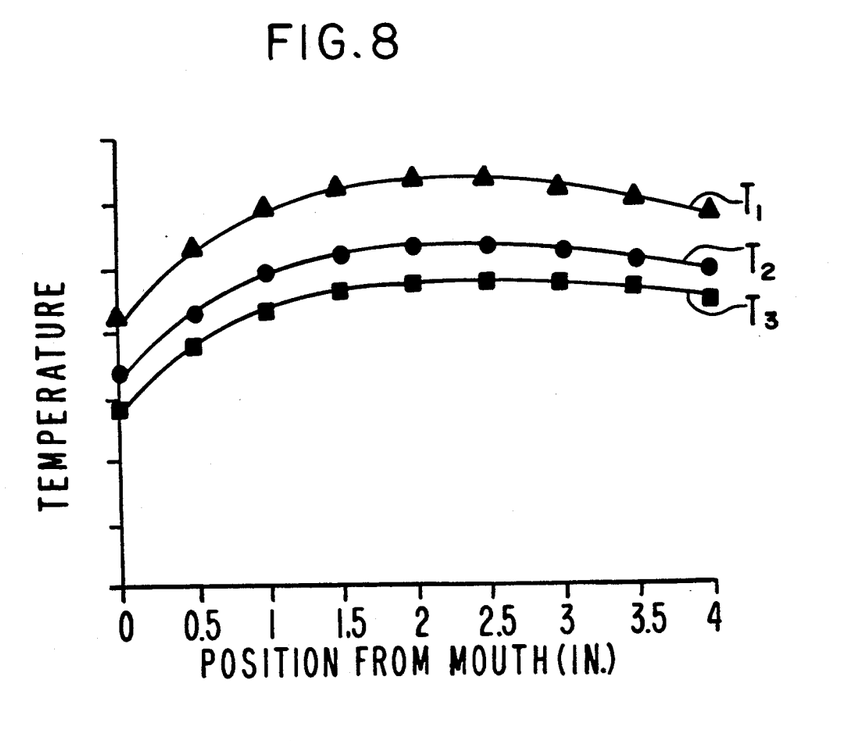

FIG. 8 shows the inverted thermal profile measured along a crucible centerline using an embodiment of this invention with a thermal sink at the crucible closed end. These measurements were made by placing a thermometer along the centerline of the crucible without any materials in the crucible. Different temperatures $T_3-T_1$ were set using the furnace thermostats. Although similar measurements have not been made during effusion of materials from the source it is believed that an inverted temperature gradient approaching those shown exists during actual operation of the equipment.

Fourth Embodiment

Figure 6:
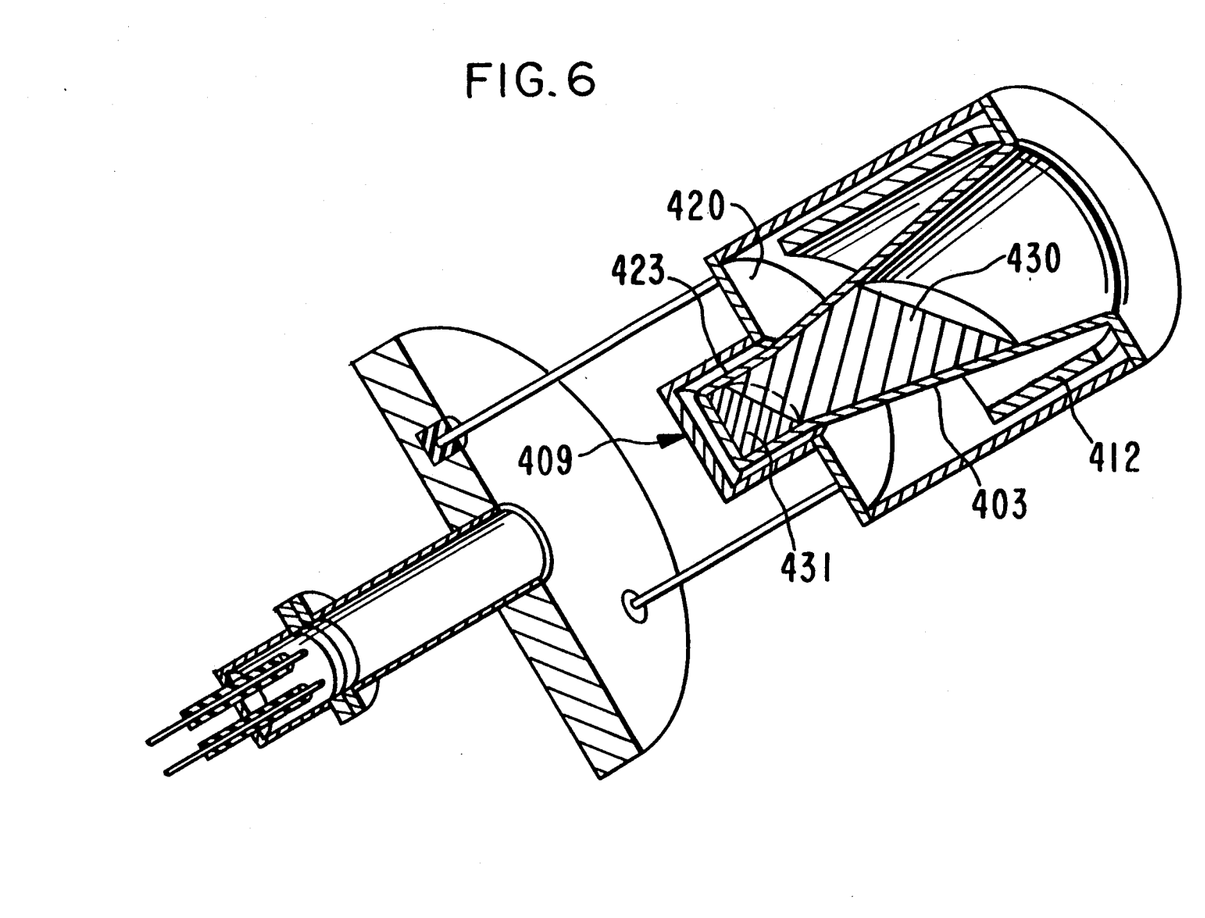
FIG. 6 shows, in partial section, a special crucible design and its relationship to other features of the source of this invention including a thermal sink.

FIG. 6 shows another embodiment of the source of this invention incorporating a crucible designed to utilize the reverse temperature gradient made possible by a thermal sink 409 and an asymmetric crucible heater 412. This "inverted" temperature gradient suppresses free convection within a liquid, effusing material. The sink can be cooled as in FIG. 4 or simply open to allow increased radiation loss as in FIG. 2a. Contaminants 431 more dense than the source material tend to segregate and accumulate at the cooler, closed crucible end. Hence, the crucible 403 has a special extension 423 projecting through the source base 420 into a thermal sink 409. This extension allows much greater cooling than the closed ends of crucibles of the other embodiments. The intention being not just to limit convection motion, but (in the extension) to limit participation in the effusing beam even as the source material level drops due to depletion. The segregation alone will reduce contaminant mixing with the source material 430 and contribute to a more pure grown film. A more pure film is important to reproducible electrical properties and reduced structural defects.

Fifth Embodiment

Figure 7:
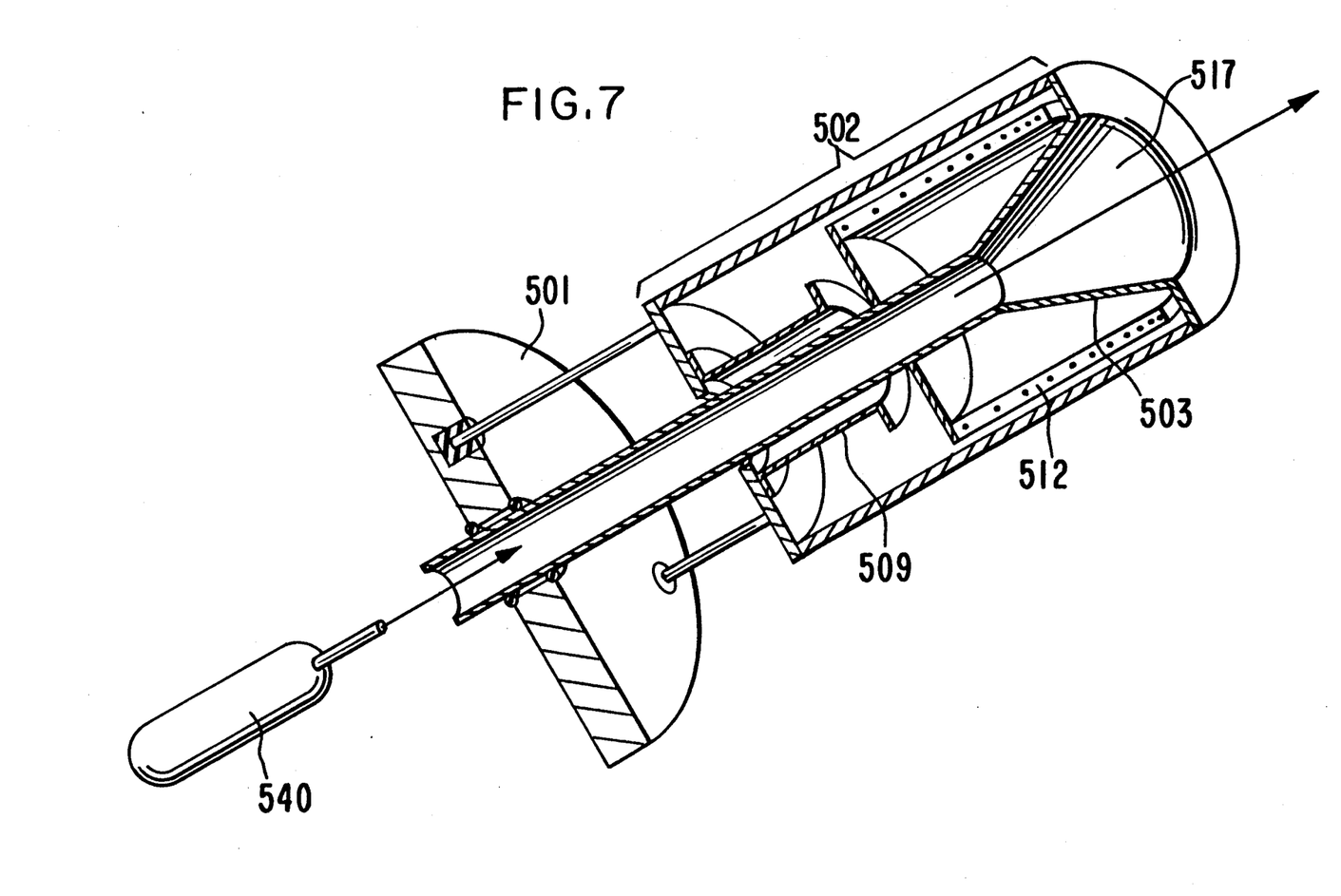
FIG. 7 is a cross sectional schematic view of an embodiment of a source which operates with a gaseous input; and, FIG. 8 shows in graph form the inverted temperature gradient achieved by the instant invention.

FIG. 7 shows another embodiment of the source of this invention where the effusing material 540 may be located external to the source body. The remote location of source material is typical of gaseous source MBE (GSMBE) and chemical beam epitaxy (CBE). Gaseous sources such as arsine, phosphine and hydrogen and heated liquid sources such as the triethyl and trimethyl group III compounds are common in these processes. These materials are located remotely for safety (containment) and process control reasons. The materials are transported to sources typical of this invention which are positioned inside MBE systems. The transfer occurs as through the use of a pressurized gas or by mixing vapors with a "carrier" gas. Hydrogen is commonly used as a carrier gas. The sources are heated by heating elements located within the source body to prevent condensation in the source or to dissociate the effusing molecules. In some instances a catalytic reaction is involved. Another example is a "cracker" source composed of two separate heated sections. The effusing material (solid or liquid) is contained in an external crucible immediately adjacent to the MBE system (usually referred to as the "sublimator"). The material is evaporated or sublimed through a connecting passage to the source body inside the MBE system (generally referred to as the "cracker"). The passage provides thermal isolation between the two heated sections which can be at widely different temperatures. The "cracker" section serves to dissociate the effusing molecules and prevent material condensation as with the gas sources mentioned above. In FIG. 7, material (from a "sublimator" or gas source) enters through mounting flange 501 and continues through the source body 502 to the exit orifice 517. Heaters 512 and sinks 509 within the source body are configured as in the earlier heater embodiments in order to produce a specific temperature profile within the cracker section 503.

While this invention has been described by reference to specific devices and specific results, it should be understood that it is not the intention of the inventors to obtain coverage for their invention limited to such specific disclosure. Instead it is the intent of the authors to obtain protection including equivalents within the scope of the appended claims.

What is claimed is:

1. In a source for the generation of molecular beams comprising a mounting flange, support means for said source, a source body comprising a crucible heater, thermal shield means, heat sink means, a thermocouple and a crucible to contain material for the generation of molecular beams, said support means for said source adapted to position the axis of said source body at an angle to the horizontal, the improvement comprising, a crucible heater having elements arranged in an asymmetric pattern around the source body axis to create substantially uniform temperature planes in said crucible substantially parallel to the horizontal when in position on said support means.

2. A source in accordance with claim 1 in which the heater elements comprise helis wire segments positioned around the source axis to create temperature differences along the source axis and temperature planes of like temperature along the source parallel to the horizontal.

3. The source in accordance with claim 2 in which said heater elements are arranged in pairs and are counterwound and substantially matched in length to balance out magnetic fields from said wires.

4. The source in accordance with claim 3 wherein the net electric fields created by the heater are minimized outside the main body of said source.

5. A crucible heater as in claim 2, wherein the number of turns per unit length are different in different sections of the winding to furnish different amounts of heat to the source.

6. A crucible heater as in claim 4, wherein the heater elements are of an irregular or asymmetric pattern with respect to the source body.

7. The source in accordance with claim 2 in which temperature across the source is varied by, at least in part, varying the pitch of the solenoidal windings.

8. The source in accordance with claim 2 including a shield circling said crucible and positioned within the outer wall of said source.

9. A source according to claim 2 in which the helical segments include such segments having different pitches 80 as to heat in a controlled manner.

10. A source in accordance with claim 2 in which the helical wire segments are maintained in position with minimal interference to their thermal radiation by, thin rectangular insulators whose width is approximately a helix's internal diameter and said helical wire segments are retained by insulating rings and held in radial alignment to the source axis by a retaining wire threading through each insulator end.

11. A source in accordance with claim 1 including a crucible having a closed and an open end and having a reservoir at the closed end.

12. A molecular beam source as in claim 1, wherein the positioning of thermal shields and sinks are dynamic and can be adjusted in situ from outside the growth process chamber.

13. A molecular beam source as in claim 12, wherein the crucible is combined with a thermal sink.

14. A molecular beam source as in claim 1, wherein the crucible heater is designed and arranged within the body of said source to accommodate asymmetry of a liquid source material relative to the source axis due to gravity.

15. A source in accordance with claim 1 including means to create a temperature inversion with heating means adapted to apply more intense heat toward the open end of the crucible.

16. A furnace for MBE apparatus comprising a source, mounting means to position and hold said source within said MBE apparatus at an angle to the horizontal and at an angle to the vertical, a crucible within said source having a sealed end and an open end to hold material to be melted into an effusing molecular beam, heating means having an asymmetric configuration in surrounding relationship to said crucible to heat material in said crucible to temperatures at which effusion occurs comprising heating elements around the source axis in an asymmetric pattern to apply substantially uniform amounts of heat to said crucible in substantially parallel patterns which are substantially parallel to the horizontal when said furnace is mounted within said MBE apparatus.

17. A furnace as in claim 16, including a thermal sink wherein the lower temperature region is bounded by a liquid cooled surface.

18. A furnace in accordance with claim 10 in which said mounting means is adapted to position and hold said source within said MBE apparatus with the axis of said crucible at an angle of from about 10 to about 45 degrees from the horizontal in said MBE apparatus.

19. A method of generating molecular beams from a source positioned at an angle to the horizontal in an MBE equipment comprising heating said source asymmetrically around the source axis to create the same temperature across segments that are parallel to the horizontal, selectively heating the open end of said source to a temperature higher than the rest of the heating temperature being applied to the rest of said heat zones, to cause said source to develop an inverted temperature pattern.

20. A method of generating molecular beams in accordance with claim 19 further comprising positioning electrical heating element wires so as to avoid extraneous magnetic or electric fields generated by current flowing through said wires.

21. A method in accordance with claim 16 including adjusting the thermal shields and the heat sinks associated with the source during generation of molecular beams.

* * * * *